(12) United States Patent
Opower et al.

(10) Patent No.: US 7,019,818 B2
(45) Date of Patent: Mar. 28, 2006

(54) APPARATUS FOR EXPOSING SUBSTRATE MATERIALS

(75) Inventors: Hans Opower, Krailling (DE); Stefan Scharl, Wasserburg (DE)

(73) Assignee: KLEO Halbleitertechnik BmbH & Co KG, Tettnang (DE)

( * ) Notice: Subject to any disclaimer, the term of this patent is extended or adjusted under 35 U.S.C. 154(b) by 0 days.

(21) Appl. No.: 10/941,308

(22) Filed: Sep. 14, 2004

(65) Prior Publication Data

US 2005/0083509 A1 Apr. 21, 2005

Related U.S. Application Data

(63) Continuation of application No. PCT/EP03/02578, filed on Mar. 13, 2003.

(30) Foreign Application Priority Data

Mar. 15, 2002 (DE) ................................ 102 12 344

(51) Int. Cl.
*G03B 27/58* (2006.01)
*G03B 27/42* (2006.01)

(52) U.S. Cl. .......................................... 355/72; 355/53

(58) Field of Classification Search .................. 355/53, 355/72–76; 310/10, 12; 378/34, 35; 318/687
See application file for complete search history.

(56) References Cited

U.S. PATENT DOCUMENTS 1,030,522 A 6/1912 McFeely

| | | | |
|---|---|---|---|
| 6,421,112 B1* | 7/2002 | Bisschops et al. | 355/53 |
| 6,498,350 B1* | 12/2002 | Kwan et al. | 250/442.11 |
| 6,785,005 B1* | 8/2004 | Inoue | 356/500 |
| 6,819,404 B1* | 11/2004 | Tanaka | 355/72 |
| 2003/0218730 A1 | 11/2003 | Murakami et al. | |

FOREIGN PATENT DOCUMENTS

| | | |
|---|---|---|
| EP | 0 052 892 | 6/1982 |
| EP | 0 557 100 | 8/1993 |
| EP | 1 052 549 | 11/2000 |
| EP | 1 122 609 | 8/2001 |
| WO | 99/27569 | 6/1999 |

\* cited by examiner

*Primary Examiner*—Henry Hung Nguyen
(74) *Attorney, Agent, or Firm*—Lipsitz & McAllister, LLC

(57) ABSTRACT

The invention relates to a device for exposing substrate materials comprising: at least one optical exposure device, at least one substrate platform; a device for generating a relative displacement between the exposure device and the substrate platform in two transversal directions, whereby the relative displacement in a primary direction occurs with a greater dynamic response than in a secondary direction; at least one primary drive for generating the relative displacement in the primary direction; and at least one secondary drive for generating the relative displacement in the secondary direction. The aim of the invention is to position the substrate platform with the greatest possible accuacry and the greatest possible dynamic response. To achieve this, the device comprises two substrate platforms that move substantially in opposition to one another in the primary direction.

47 Claims, 13 Drawing Sheets

APPARATUS FOR EXPOSING SUBSTRATE MATERIALS

This application is a continuation of international application number PCT/EP03/02578 filed on Mar. 13, 2003.

The present disclosure relates to the subject matter disclosed in international application No. PCT/EP03/02578 of Mar. 13, 2003 and German application No. 102 12 344.6 of Mar. 15, 2002, which are incorporated herein by reference in their entirety and for all purposes.

BACKGROUND OF THE INVENTION

The invention relates to an apparatus for exposing substrate materials, comprising at least one optical exposure device, at least one substrate table, an apparatus for generating a relative movement between the exposure device and the substrate table in two directions running transversely with respect to one another, the relative movement being effected with a greater dynamic in a main direction than in a secondary direction, at least one main drive for generating the relative movement in the main direction and at least one secondary drive for generating the relative movement in the secondary direction.

With known apparatuses of this type, the problem constantly arises of combining the highest possible precision of positioning of the substrate table with the highest possible dynamics when moving the latter.

The invention is therefore based on the object of improving an apparatus of the type described in the introduction in such a manner that this apparatus, while having the highest possible dynamics, also has the highest possible positional accuracy when the substrate table is being positioned.

SUMMARY OF THE INVENTION

In an apparatus of the type described in the introduction, this object is achieved, according to the invention, by virtue of the fact that the apparatus has two substrate tables which move substantially in opposite directions in the main direction.

This solution creates the possibility of moving the substrate tables with high dynamics, in particular great accelerations, without great acceleration forces having to be absorbed, since the movement of the substrate tables in opposite directions substantially cancels out the acceleration forces.

To realize this, it is preferably provided that a main drive is associated with each substrate table.

There is a very wide range of conceivable options in terms of the interaction between the main drive and the substrate table. By way of example, the main drive could be disposed in such a way that it drives the substrate table directly or indirectly.

However, it is particularly expedient if the main drive is disposed separately from the substrate table.

This solution leads to good thermal decoupling and good mechanical coupling of the main drive from the substrate table, and in particular its guidance.

To allow favorable realization of a coupling between the main drive and the substrate table, it is preferably provided that a traveller of the main drive drives the respectively associated substrate table via a drive connection which is rigid in the main direction.

This on the one hand produces a rigid coupling between the traveller of the main drive and the substrate table, allowing accurate guidance and positioning of the substrate table, and on the other hand produces sufficiently good thermal decoupling, and in particular also vibrational decoupling between the two, reducing the vibrations generated by the main drive and transmitted to the substrate table to a minimum.

In this context, it is expedient for each substrate table to be disposed on a carrier carriage and to be guided in the main direction by the latter.

One particularly expedient form of coupling between the traveller and the substrate table is made possible by the traveller and the carrier carriage of the substrate table being coupled to one another via the drive connection which is rigid in the main direction.

As an alternative or in addition, the object specified in the introduction is also achieved, in an apparatus in accordance with the invention, by virtue of the fact that the traveller of the main drive is guided in the X direction on guide surfaces which are separate from guide surfaces running in the X direction for the carrier carriage. This solution also allows as far as possible optimum decoupling of the traveller of the main drive from the guide carriage and the carrier carriage which carries the guide carriage, in order likewise to minimize the thermal influence of the main drive on the guidance of the carrier carriage and on the other hand also to optimize the vibrational decoupling of the two.

There are two favorable options with regard to the way in which the substrate tables and the main drives are disposed relative to one another.

One possibility provides for the substrate tables to be disposed between the main drives.

Another possibility provides for the main drives to be disposed between the substrate tables.

It is particularly expedient in this context if the main drives for the substrate tables are combined in a common drive unit, so that the oppositely running acceleration forces act on this common drive unit and can cancel themselves out therein.

In this context, it is preferable for the drive unit to be realized in such a way that the drive carriage carries the common drive unit, and therefore the drive carriage for its part does not have to absorb high acceleration forces, since these forces all at least substantially compensate for one another in the drive unit.

An apparatus of this type can be realized particularly effectively by virtue of the substrate tables being disposed on opposite sides, as seen in the main direction, of the drive unit.

In order in this case to realize a solution which is as compact as possible, it is preferably provided that the main drives work in drive planes running at a spacing from another in a direction that is transverse with respect to the main direction and transverse with respect to the secondary direction, thereby creating the possibility of minimizing the space required for the drive unit in the main direction.

In this context, it is particularly expedient if the traveller of the main drive for one substrate table works in one drive plane and the traveller of the main drive for the other substrate table works in the other drive plane, which is parallel to the one drive plane.

Furthermore, one advantageous solution to the object identified in the introduction provides, as an alternative or in addition to the exemplary embodiments which have been described hitherto, in an apparatus of the type described in the introduction, that, according to the invention, the relative position of substrate table and exposure device can be recorded by an interferometric measuring device.

Hitherto, no further details have been given in terms of the way in which the at least one exposure device and the substrate tables are associated with one another. The apparatus according to the invention is particularly advantageous in terms of the efficiency of exposure of substrates if an exposure device is associated with each of the substrate tables.

In this context, it is preferably provided that the substrate table and the respectively associated exposure device are movable relative to one another in the main direction and in the secondary direction, so that as a result controllable exposure of the substrate can be carried out at each of the substrate tables in conjunction with the exposure device.

An interferometric measuring device of this type has the major advantage of allowing the position of the substrate table to be measured with an accuracy in particular in the nanometer range.

A particularly high measurement accuracy during determination of the position of the substrate table can be achieved if the interferometric measuring device works with an optics head of the optical exposure device as reference point, i.e. all the measurements carried out by the interferometric measuring device are referenced to the position of the optics head as reference position.

The interferometric measuring device can in this case be integrated spatially in a particularly effective way in an apparatus according to the invention if this device records the position of the optics head in a reference plane running parallel to the main direction and to the secondary direction and records the position of the substrate table in a measuring plane running parallel to the reference plane.

To record the individual positions, it is preferably provided that the interferometric measuring device works, in the reference plane and in the measuring plane, with measuring beams which impinge on mirrors extending in the main direction and the secondary direction. This makes it possible in particular to determine distances via interference in a simple way.

A particularly expedient implementation option provides for the optics head to be provided with a reflection mirror extending in the main direction and a reflection mirror extending in the secondary direction.

With regard to the recording of the substrate table, it is expedient if the substrate table is provided with a mirror extending over the maximum path of the substrate table at least in the main direction. This allows favorable recording of the position of the substrate table in the secondary direction in particular even if the substrate table moves.

Furthermore, it is preferably provided that the substrate table is provided with a mirror which extends at least over the maximum path in the secondary direction, by means of which mirror, in the event of the substrate table moving, the position of the latter in the main direction can also be expediently determined.

A particularly high measurement accuracy can be achieved using the interferometric measuring device if the interferometric measuring device carries out measurement using laser light of the same wavelength in both the main direction and the secondary direction.

This can be achieved particularly advantageously if the interferometric measuring device works using laser light from a common laser radiation source.

To optimize the focusing of the light from the optical exposure device on the substrate which is to be exposed, it is preferably provided that the optical exposure device is provided with an autofocusing system, which at the same time also balances out minor inaccuracies in the guidance of the substrate table relative to the guide plane.

Hitherto, no more detailed information has been provided with regard to the way in which the substrate table is fed with substrate materials. For example, it would be conceivable for the substrate materials to be positioned manually on the substrate table and to be oriented manually for exposure using the exposure device.

However, a particularly expedient solution provides that the apparatus has a transport system which can be used to transport substrate materials from a preparation station onto the substrate table. An apparatus of this type has the advantage of allowing the time required for positioning of the substrate materials on the substrate table to be reduced.

This is particularly expedient if the substrate materials can be pre-positioned in the preparation station and can be placed on the substrate table in a pre-positionable manner by the transport system.

This provides the option of carrying out the time-consuming preliminary positioning of the substrate materials in the preparation station, so that substrate materials which are already present on the substrate table can be exposed, for example, during the preliminary positioning of the substrate materials, and then the substrate materials which have been pre-positioned can be placed on the substrate table by the transport system, while maintaining the pre-positioning, after the exposed substrate materials have been removed from the substrate table.

In order also to make the removal of the exposed substrate materials as efficient as possible, it is preferably provided that the apparatus has a transport system which can be used to transport exposed substrate materials from the substrate table into a removal station.

The object identified in the introduction is, as an alternative or in addition, achieved, in an apparatus of the type described in the introduction, by virtue of the fact that, according to the invention, the drive for the main direction is seated on a drive pedestal body, which is disposed so as to be physically separate from a pedestal body which carries the exposure device and the substrate table.

The advantage of the solution according to the invention is therefore considered to reside in the fact that all negative influences of the main drive for the main direction, such as for example strong accelerations and temperature changes, do not have a direct effect on the positioning accuracy of the substrate table relative to the exposure device, since both the substrate table and the exposure device are carried by a pedestal body which is disposed so as to be physically separate from the drive pedestal body.

If it is also taken into consideration that pedestal bodies of this type are preferably bodies of a large mass, in particular in the range of tonnes, the physically separate pedestal bodies produce optimum decoupling between the drive pedestal body and the pedestal body for the exposure device and the substrate table.

No further details have been provided with regard to the form of the apparatus for generating the relative movement between the exposure device and the substrate table in connection with the basic concept of the invention. By way of example, it would be conceivable on the one hand to move the exposure device in one axis direction and on the other hand to move the substrate table in the other direction.

However, it is particularly advantageous if the exposure device is held in a stationary position on the pedestal body. This has the advantage that the stationary position of the exposure device relative to the pedestal body allows all the mechanical damping properties of the pedestal body to be utilized in order to minimize the transmission of shaking and vibration to the exposure device.

Furthermore, this solution has the advantage that it is possible to simplify recording of the relative position between the exposure device and the substrate table by virtue of the stationary positioning of the exposure device on the pedestal body producing, in a simple way, a reference point for the measuring device for determining the position of the substrate table.

For this reason, the substrate table is preferably movable in the main direction and the secondary direction.

To allow favorable realization of this movability of the substrate table, it is preferably provided that the substrate table is disposed on a carrier carriage which is movable relative to the pedestal body in the main direction and the secondary direction.

On the other hand, however, this movability must be associated with accurate guidance of the carrier carriage.

Therefore, for accurate guidance of the carrier carriage, it is preferably provided that the carrier carriage is guided on a guide carriage in such a manner that it is movable in the direction of the main direction, with the guide carriage for its part being movable relative to the pedestal body at least in the secondary direction.

To ensure that the carrier carriage is guided as accurately as possible on the guide carriage, it is preferably provided that the carrier carriage is guided on the guide carriage so as to prevent relative movement only in the secondary direction, but not in any further direction, so that the guidance of the carrier carriage on the guide carriage can be defined with a high degree of accuracy and the guides for the other directions have no adverse effect on the accuracy of the guidance of the carrier carriage on the guide carriage.

Particularly accurate and easy guidance can be achieved if the carrier carriage is guided on the guide carriage using air guides, with the guidance being effected in particular by air cushions. Air cushions of this type not only have the advantage of providing easy guidance, but also have the advantage of a high level of attenuation of mechanical vibrations.

To provide accurate guidance for the carrier carriage during movement transversely with respect to the main direction and secondary direction, it is preferably provided that the carrier carriage is guided in a direction which is transverse with respect to the main direction and secondary direction on a guide plane of the pedestal body.

The guide plane therefore allows a movement of the carrier carriage both in the main direction and in the secondary direction and effects particularly accurate guidance in the direction perpendicular to these directions.

In this context, it is particularly expedient if the carrier carriage is guided on the pedestal body using air guides, so that very easy yet nevertheless accurate guidance, in particular with vibration attenuation, is provided for the carrier carriage.

Since the accuracy of guidance of the carrier carriage in the direction transverse with respect to the main direction and with respect to the secondary direction is dependent on the quality of the guide plane, it is preferably provided that the guide plane be formed by a ground surface, or even more preferably by a polished surface.

In this context, it is preferable for the pedestal body to be formed from a heavy material which, as guide plane, has a ground and polished surface. In this context, it is particularly expedient if the pedestal body is produced from a rock, in particular granite.

To achieve the highest possible accuracy, it is particularly advantageous if the substrate table can be oriented in the direction of the secondary direction relative to the guide carriage, so that it is possible to carry out positional corrections, in particular translational and/or rotational corrections, to the substrate table by means of movements in the direction of the secondary direction and thereby to retrospectively compensate for inaccuracies resulting from the mechanical structure or the thermal behavior of the mechanical structure.

In this context, it is particularly expedient if the substrate table can be oriented relative to the guide carriage by positioning elements acting in the secondary direction, which elements allow accurate repositioning of the substrate carriage.

The positioning elements may in this case be manually actuable. A particularly expedient solution provides for the positioning elements to be actuable by a control unit, thereby providing the option of controlled correction of the orientation of the substrate table in the secondary direction at any desired operating time.

The positioning elements may be formed in a wide variety of ways. They may be Lorenz motors or moving coil servomotors. A particularly expedient embodiment provides for the positioning elements to be piezo elements.

Hitherto, no more detailed information has been given with regard to the positioning of the guide carriage in the secondary direction itself. Therefore, a particularly expedient solution provides that the guide carriage can be moved in the secondary direction by two secondary drives which are disposed at a spacing from one another in the main direction. This solution has the advantage that it is possible to achieve highly accurate guidance of the guide carriage in the secondary direction, since synchronous operation of the two secondary drives allows the guide carriage to be moved with an accurate orientation in the secondary direction by means of controlled orientation.

As an alternative or in addition to the exemplary embodiments described above, the object described in the introduction is also achieved, in an apparatus of the type described in the introduction, by virtue of the fact that, according to the invention, the main drive is seated on a drive carriage which is separate from the guide carriage and for its part is guided movably in the secondary direction on the drive pedestal body by a secondary drive.

This separation of the main drive from the guide carriage, which for its part guides the carrier carriage, likewise serves to optimize the thermal and also mechanical decoupling of the main drive from the guide for the carrier carriage, which can be realized with an extremely high level of accuracy.

There is also a very wide range of options with regard to the guidance of the drive carriage transversely with respect to the main direction and secondary direction.

In this context, it is particularly expedient if the drive carriage is guided, transversely with respect to the main direction and transversely with respect to the secondary direction, on a guide plane of the drive pedestal body.

The guide plane should likewise have an optimum guide quality for the drive carriage.

For this reason, it is preferably provided that the guide plane be formed as a ground surface, and it is even more expedient for the guide plane to be formed as a polished surface.

In this context, the drive pedestal body is in particular likewise a body which is as heavy as possible, preferably made from granite.

To guide the drive carriage as easily as possible, it is preferably provided that the drive carriage be guided on the drive pedestal body using air guides.

In order, in the event of a movement of the guide carriage in the secondary direction, to ensure that there is no guide inaccuracy whatsoever caused by an offset relative to the movement of the drive carriage, it is preferably provided that the drive carriage is movable synchronously with respect to the guide carriage.

In this case, it is preferable for the secondary drives for moving the drive carriage and the guide carriage to be synchronized with one another.

Hitherto, it is also the case that no further details have been given with regard to the realization of the main drive. Therefore, a particularly advantageous exemplary embodiment provides for a traveller of the main drive to be guided movably in the main direction on the drive carriage.

To transmit the movements of the traveller to the carrier carriage, it is preferably provided that a drive connection which is rigid in the main direction be provided between the traveller and the carrier carriage, this drive connection preferably also being formed in such a way as to have a certain movability transversely with respect to the main direction.

Further features and advantages of the invention form the subject matter of the following description and of the illustration of a number of exemplary embodiments in the drawing.

DETAILED DESCRIPTION OF THE INVENTION

Figure 1:
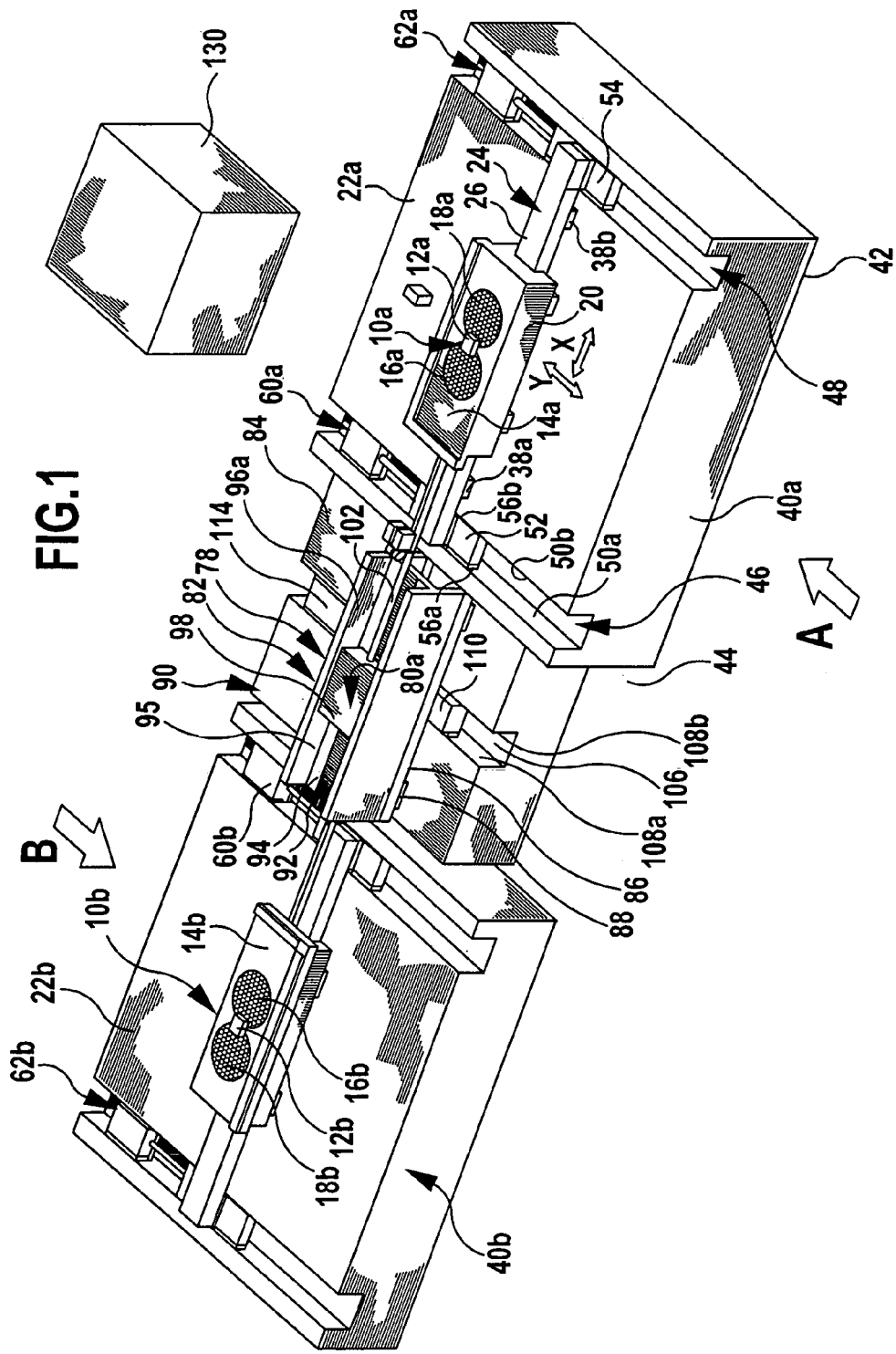
FIG. 1 shows a perspective view of an apparatus according to the invention for exposing substrate materials, with the exposure device represented just by an optics head.

An exemplary embodiment of an apparatus according to the invention for exposing substrate materials, illustrated in part in FIGS. 1 and 2, comprises two exposure devices 10a, b, each of the exposure devices 10a, b in FIGS. 1 and 2 being represented only by an optics head 12a, b; the way in which they are disposed will be explained in detail below.

Furthermore, the apparatus according to the invention comprises two substrate tables 14a, b, on which substrates 16, 18 which are to be exposed are disposed in order for them to be exposed by means of the optical exposure devices 10a, b.

This requires a relative movement between the respective substrate table 14a, b with the substrates 16, 18 and the respective optics head 12a, b.

For reasons of simplicity, there will first of all follow a description of the conditions which result for one of the optics heads 12a, b and the corresponding one of the substrate tables 14a, b, but since the description applies equally to both optics heads 12a, b and the corresponding substrate tables 14a, b, the letters a, b are omitted.

In the exemplary embodiment of the apparatus for exposing substrate materials, such as for example wafers, according to the invention which is illustrated, this relative movement is realized by virtue of the fact that the substrate table 14 is movable in an X direction and a Y direction relative to the exposure device 10.

For this purpose, the substrate table 14 is disposed on a carrier carriage 20, which is guided slidably on a guide plane 22 running parallel to the X direction and parallel to the Y direction, with the guide plane 22 extending transversely, preferably approximately in the horizontal, with respect to a vertical.

Furthermore, the carrier carriage 20 is for its part guided on a guide carriage 24 which extends with a longitudinal guide 26 parallel to the X direction, along which guide the carrier carriage 20 can be moved in the X direction but is guided such that it cannot move in the Y direction.

Figure 2:
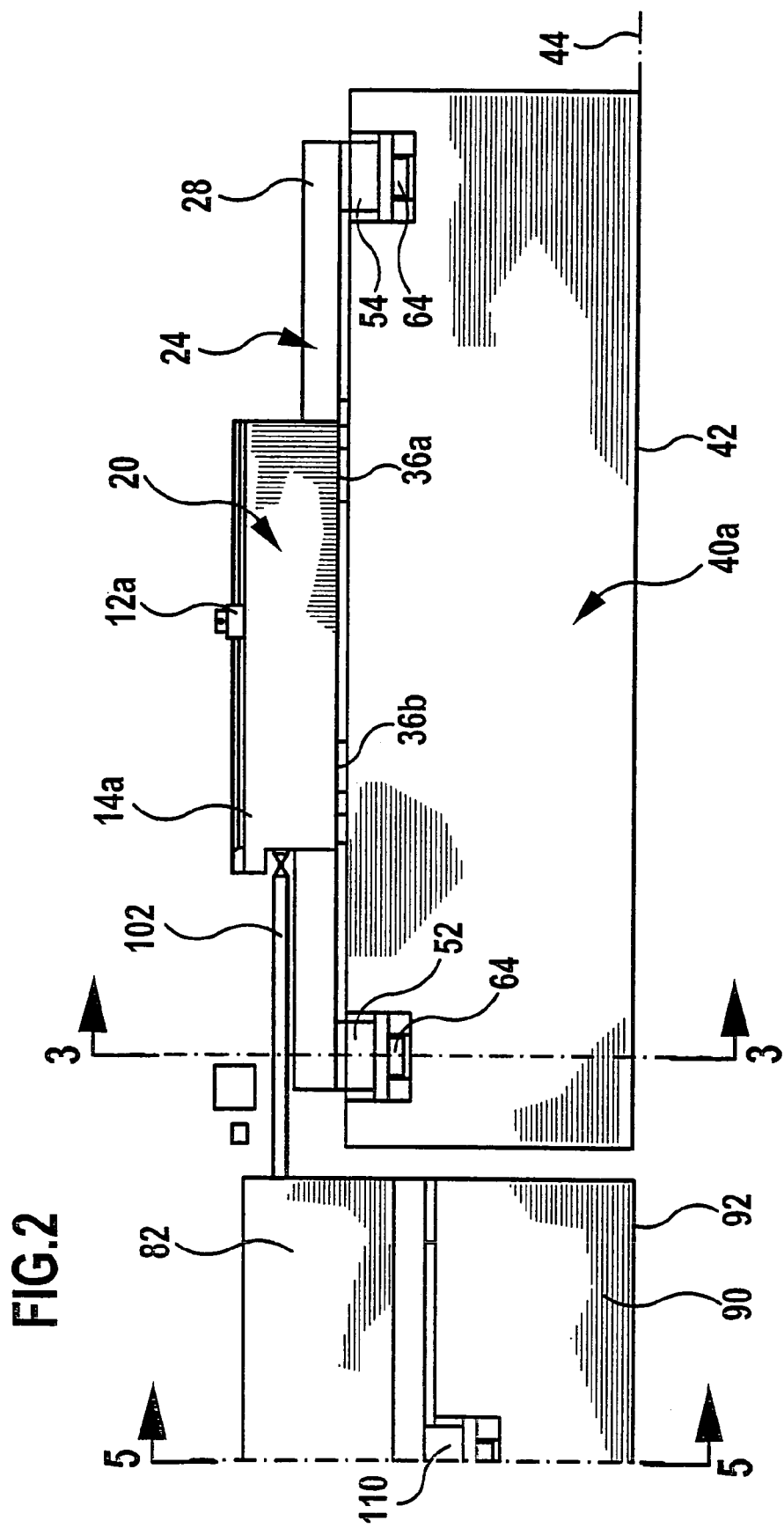
FIG. 2 shows an enlarged view of one half of the apparatus illustrated in FIG. 1, seen in the direction of arrow A in FIG. 1.

As illustrated in FIG. 2, the longitudinal guide 26 is preferably formed by an elongate guide bar 28 which has side guide surfaces 30a and 30b on opposite sides, which extend transversely with respect to the Y direction and preferably in planes running parallel to the X direction and parallel to the Z direction, which for its part is perpendicular to the X and Y directions.

Figure 3:
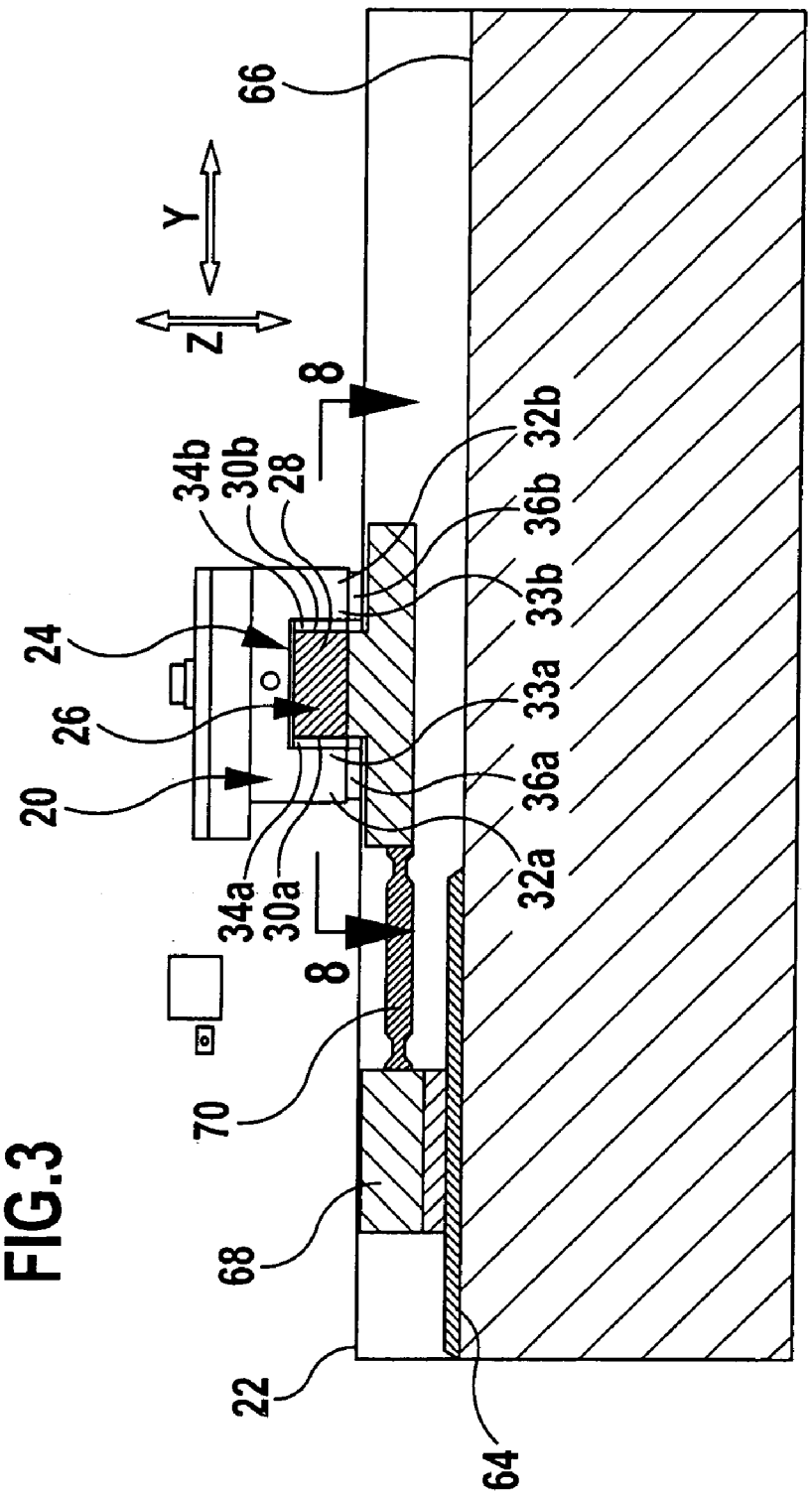
FIG. 3 shows a section on line 3—3 in FIG. 2.

For its part, the carrier carriage 20 engages, by means of side limbs 32a, b, around the guide bar 28 in an inverted U shape, so that the side limbs 32a, b of the carrier carriage 20 extend on both sides of the guide bar 28, with their ends 33a, b facing the guide plane 22 (FIG. 3).

These side limbs 32a, b carry, on their sides facing the guide surfaces 30a, b, devices 34a, b for generating air cushions, so that air cushions which guide the carrier carriage 20 in the Y direction on the guide bar 28 are formed between these devices 34a, b and the guide surfaces 30a, b.

Furthermore, the side limbs 30a, b are likewise provided, at their ends 33a, b facing the guide plane 22, with devices 36a, b for generating air cushions, which each generate air cushions between them and the guide plane 22, so that the carrier carriage 20 can slide over the guide plane 22 on these air cushions.

Furthermore, the guide carriage 24 is for its part also guided slidably by devices 38a, b for generating air cushions on the guide plane 22, these devices 38a, b likewise forming air cushions between them and the guide plane 22, so as to guide the entire guide carriage 24 slidably on the guide plane 22.

In the apparatus according to the invention for exposing substrate materials, the guide plane 22 is preferably formed by a surface of a pedestal body 40, the pedestal body 40 preferably being a granite block with a polished surface which represents the guide plane 22 and is therefore a highly accurate surface for guiding the carrier carriage 20.

The pedestal body 40 is preferably seated, by means of an underside 42, on a standing surface 44 for the apparatus according to the invention.

Furthermore, the pedestal body 40 is provided with two guide grooves 46, 48 which, starting from the guide plane 22, extend into the pedestal body and run in the Y direction, each of the guide grooves 46, 48 forming, by means of their mutually opposite groove walls, guide surfaces 50a, 50b which extend parallel to the Y direction and parallel to the Z direction, thereby in each case forming a guide preventing movement in the X direction.

Guide bodies 52 and 54 of the guide carriage 24, which are fixedly connected to the guide bar 28 and on opposite sides each carry devices 56a, 56b for generating air cushions, which between them and the guide surfaces 50a, b form an air cushion which guides the respective body 52 and 54 in the guide grooves 46 and 48, respectively, so that the guide carriage 24 is thereby guided such that it cannot move in the X direction relative to the pedestal body 40, are provided in these guide grooves 46 and 48.

Linear motors 60 and 62, which are disposed in the guide grooves 46 and 48 and the winding body 64 of which is preferably disposed in a stationary position on a groove base 66 of the guide grooves 46 and 48, are provided for displacement of the guide carriage 24 in the Y direction, while a traveller 68, which can be displaced by suitable energization of the winding body 64, is movable in the guide grooves 46 and 48, in each case guided in the Y direction.

It is preferable for the traveller 68 of the respective linear motor 60, 62 likewise to be guided by air cushions in the guide grooves 46 and 48.

The connection between the traveller 68 and the guide carriage 24 is preferably effected by means of a coupling rod 70 which is rigid in the Y direction and is provided between the respective traveller 68 and the corresponding guide body 52 or 54.

The movement of the substrate table 14 in the Y direction constitutes a movement in a secondary direction, while the main direction of the movement is the X direction, since during the exposure of the substrate materials 16 and 18 by means of the exposure device 10, the movement in the X direction has a far higher dynamic, on account of the considerable movement displacement compared to the movement in the Y direction.

Figure 4:
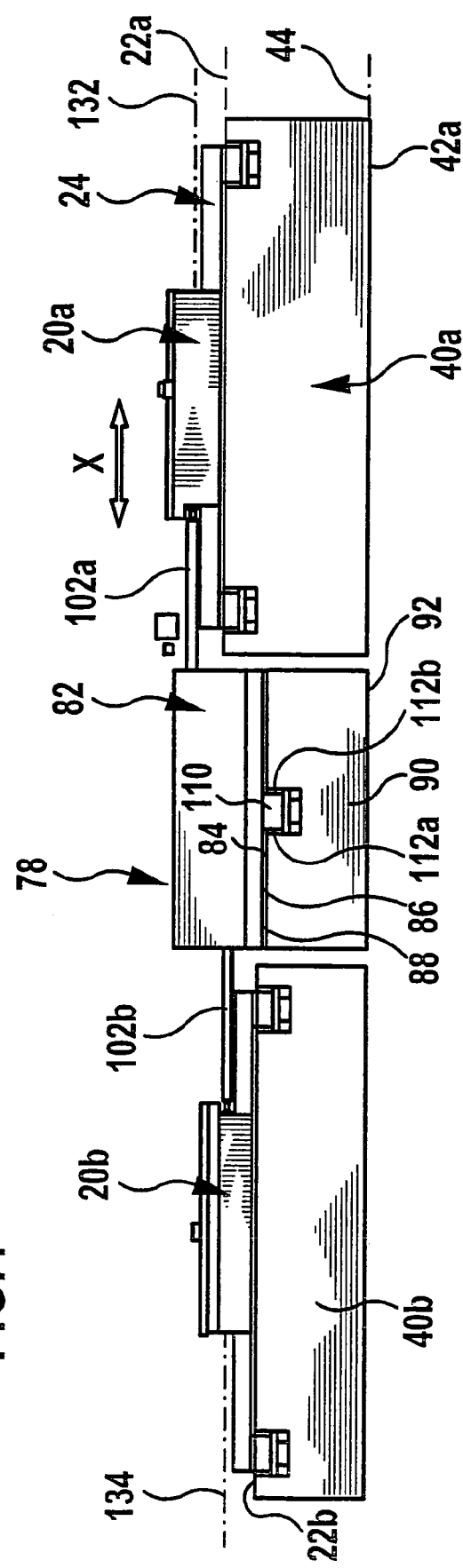
FIG. 4 shows an overall view of the first exemplary embodiment, illustrated in FIG. 1, of the apparatus according to the invention, seen in the direction of arrow A in FIG. 1.
Figure 5:
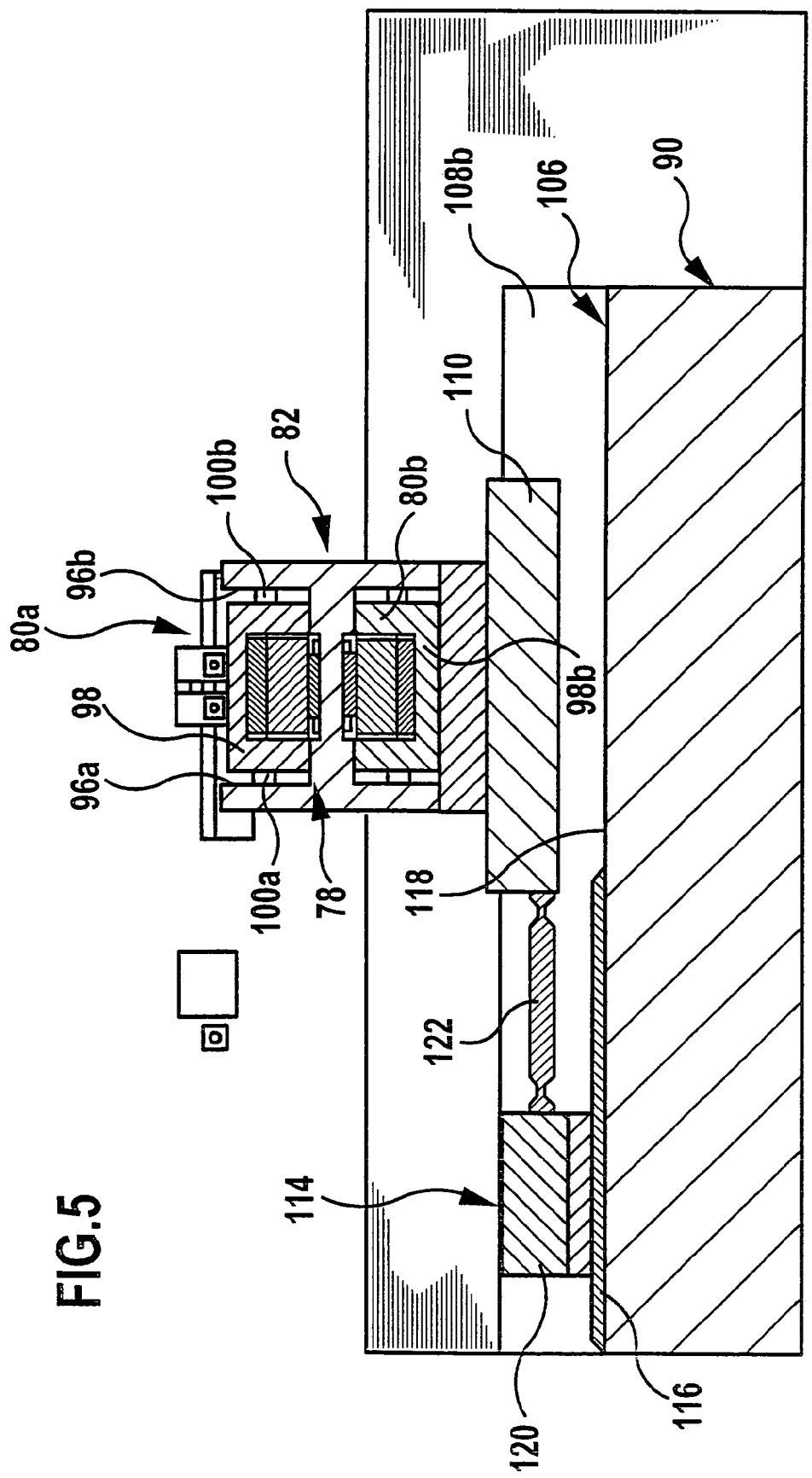
FIG. 5 shows a section on line 5—5 in FIG. 2.

For this reason, a separate drive unit 78 is provided, comprising a linear drive 80 for moving the substrate table 14 in the X direction, which linear drive is disposed on a drive carriage 82, the drive carriage 82 for its part being guided, in such a manner that it is movable in the Y direction, on a guide plane 84 which extends parallel to the X and Y directions (FIGS. 1, 4, 5).

For this purpose, the drive carriage 82 preferably has devices 88 disposed on its underside 86, for generating an air cushion between them and the guide plane 84 so that the drive carriage 82 is movable with respect to the guide plane 84 with guidance provided by the air cushions.

The guide plane 84 is in this case formed by a drive pedestal body 90, the underside 92 of which likewise stands on the standing surface 44.

In this context, the drive pedestal body 90 is completely physically separate from the pedestal body 40 for the carrier carriage 20 and the guide carriage 24.

It is preferable for the drive pedestal body 90 likewise to be formed as a granite block with a polished surface as guide plane 84.

The linear drive 80 for moving the carrier carriage 20 in the X direction comprises a winding body 92, which is disposed in a fixed position on a base 94 of a U-shaped recess 95 of the drive carriage 82, and a traveller 98, which is guided between lateral guide surfaces 96a and 96b of the U-shaped recess and, between the guide surfaces 96a, b, is guided movably in the X direction, the guidance for the traveller 98 preferably being effected by means of devices 100a, 100b for generating air cushions, which, between these devices 100a, b and the guide surfaces 96, guide the traveller 98 so that it cannot move in the Y direction.

The coupling between the traveller 98 and the carrier carriage 20 is in this case preferably effected by a coupling rod 102 which is rigid in the X direction and engages both on the traveller 98 and on the carrier carriage 20.

The drive carriage 82 is preferably guided on the drive pedestal body 90 by a guide groove 106 which is provided in the drive pedestal body 90, extends into the latter starting from the guide plane 84 and has guide surfaces 108a, 108b, which are formed by the side walls of the guide groove 106 and between which a guide body 110 is guided such that it can move in the Y direction but cannot move in the X direction; the guide body 110 is fixedly connected to the drive carriage 82.

For its part, the guide body 110 is provided with devices 112a, 112b for generating an air cushion facing the guide surfaces 108a, b, the air cushion being located between these devices 112a, 112b and the guide surfaces 108a, b.

To move the drive carriage 82 in the Y direction there is a linear motor 114, the winding carrier 116 of which is disposed on a groove base 118 of the guide groove 106 and the traveller 120 of which is movable in the Y direction in the guide groove 106, the traveller 120 preferably likewise being guided by air cushions between the guide surfaces 108a, b.

A connection between the traveller 120 and the guide body 110, which is connected to the drive carriage 82, is effected by means of a coupling rod 122 which is rigid in the Y direction.

The accelerations in the X direction which are generated by the linear drive 80 in order for the carrier carriage 20 together with the substrate table 14 to be displaced in the X direction would, on account of the high dynamics and the constant reversal of movement after they have passed over the two substrate materials 16, 18 or wafers, lead to high loads on the guidance provided by the guide body 110 between the guide surfaces 108a, b.

For this reason, the apparatus according to the invention advantageously provides a pedestal body 40a, 40b with a carrier carriage 20a, b which can be displaced thereon in the X direction on each of opposite sides of the drive carriage 82. Furthermore, two linear drives 80a and 80b are provided in the drive unit in the drive carriage 82, the linear drive 80a being intended to move the carrier carriage 20a and the drive 80b being intended to move the carrier carriage 20b, which are located on opposite sides of the drive carriage 82. Furthermore, the linear drives 80a and 80b are actuated by a control unit 130 in such a way that the travellers 98a and 98b always move substantially in opposite directions, i.e. either both carrier carriages 20a, 20b are moved away from the drive unit 78 or both carrier carriages 20a, 20b are moved toward the drive unit 78. This allows the high accelerations generated by the linear drives 80a and 80b to at least substantially compensate for each other, so that only slight forces have to be absorbed by the guide body 110 guided between the guide surfaces 108a, b, guiding the drive carriage 82 in the X direction accurately into its X position.

Disposing the linear drives 80a and 80b one above the other leads, as illustrated in FIGS. 4 and 5, to the coupling rod 102a acting in a first drive plane 132, while the coupling rod 102b acts in a drive plane 134 which runs parallel to the drive plane 132 but is offset with respect to it, for example running closer to the standing surface 44.

The guide planes 22a and 22b of the pedestal bodies 40a and 40b also have the same offset as the drive planes 132 and 134, so that the carrier carriages 20a and 20b are also guided at different heights, with the carrier carriages 20a and 20b and the guide carriage 24 preferably being of identical construction and being guided on the pedestal body 40a, b.

For this reason, all the statements which have been made hitherto with regard to the form, guidance and structure of the carrier carriages also apply to both carrier carriages 20a, 20b.

Furthermore, the pedestal bodies 40a and 40b are also disposed so as to be physically separate, preferably without any connection, with respect to the drive pedestal body 90. This is primarily associated with the fact that on account of the high dynamics associated with the driving of the carrier carriages 20a, 20b in the Z direction, high levels of heat are evolved at the linear drives 80a, 80b, which in turn is detrimental to the accurate positioning of the carrier carriages 20a, b.

Furthermore, the high dynamics mean that accelerations also have to be absorbed by the drive pedestal body 90, and these accelerations, if there is a physical separation between the drive pedestal body 90 and the pedestal bodies 40a and 40b, are not transmitted, or at least are only transmitted to a much lesser extent, to these pedestal bodies 40a, 40b.

Therefore, as a result of the drive pedestal body 90 being separate from the pedestal bodies 40a and 40b, it is possible to improve the accuracy of the highly accurate guidance of the carrier carriages 20a, 20b in the guide planes 22a, 22b.

Figure 6:
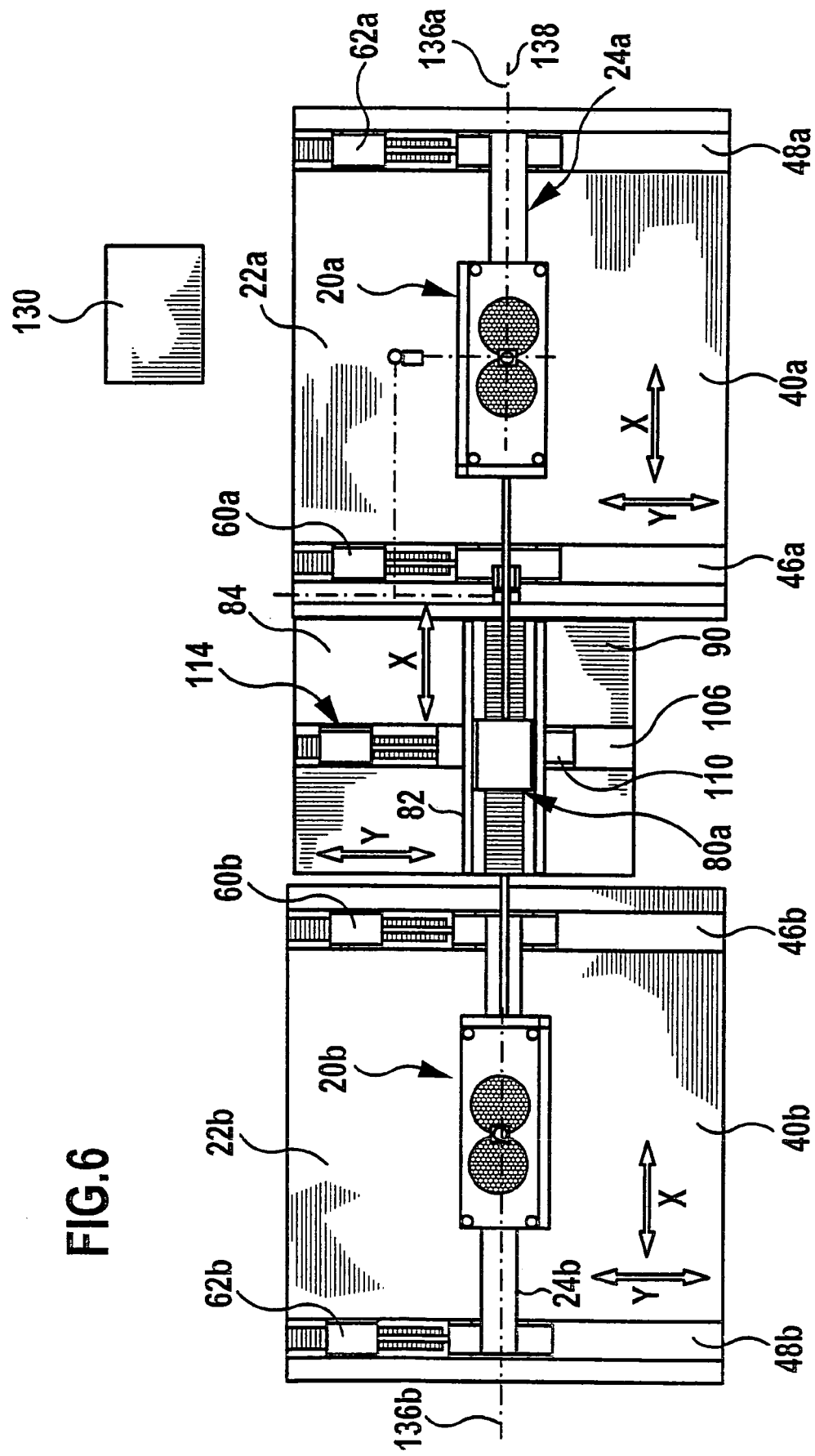
FIG. 6 shows a plan view of the first exemplary embodiment shown in FIG. 1, seen in the direction of arrow B in FIG. 1.

As illustrated in FIG. 6, the control unit 130 then controls the movement of the carrier carriages 20a, 20b by corresponding movement of the guide carriages 24a, 24b by means of the linear motors 60 and 62 and the movement of the drive carriage 82 by means of the linear motor 114 in the Y direction, in such a manner that the movement of the carrier carriages 20a and 20b and of the drive carriage 82 takes place synchronously, in such a manner that a center axis 136a which is in the drive plane 132 and a center axis 136b which is in the drive plane 134 are always located in a common orientation plane 138 which runs perpendicular to the drive planes 132 and 134 and therefore parallel to the Z direction.

Figure 7:
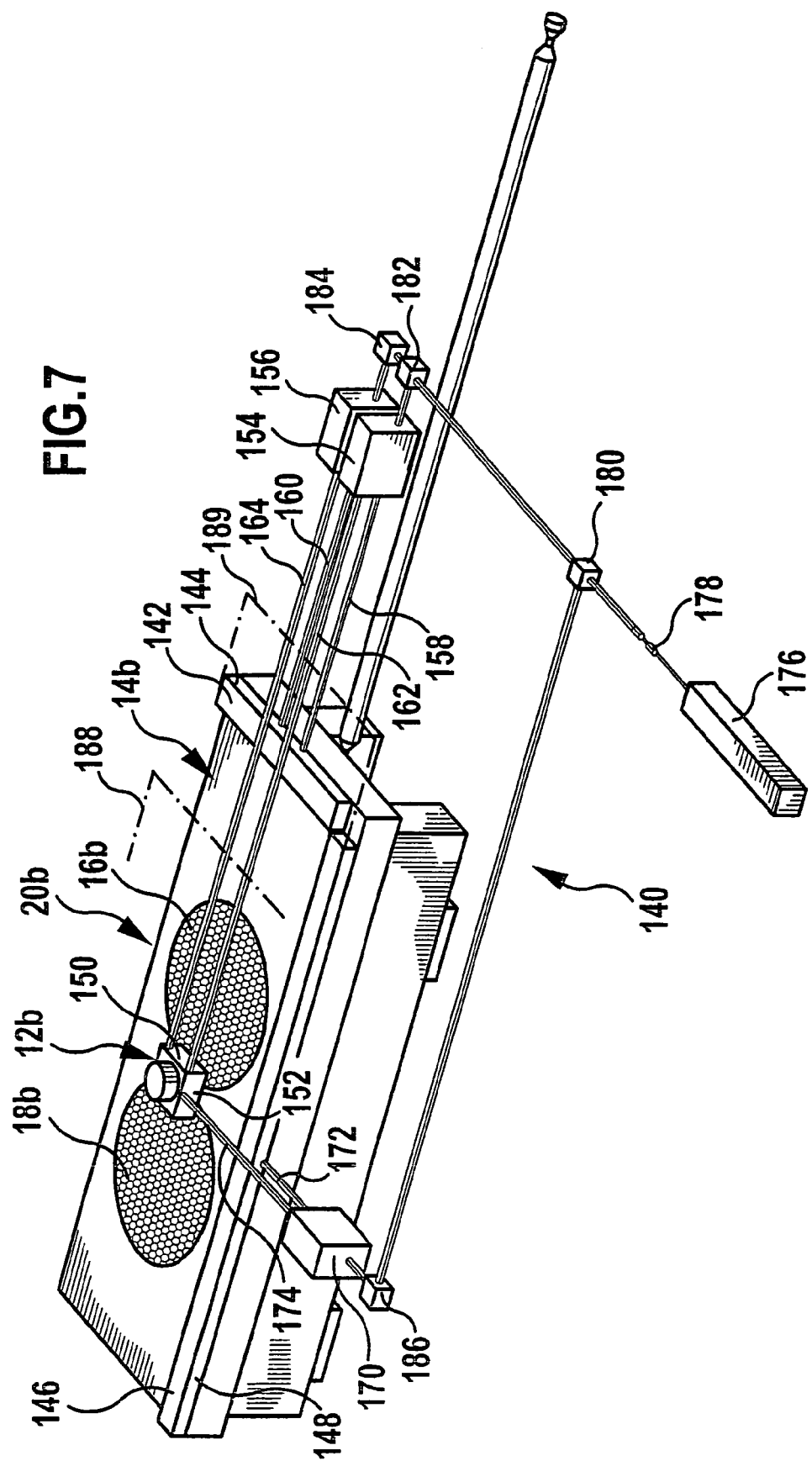
FIG. 7 shows an enlarged illustration of a substrate table having the transport carriage of the first exemplary embodiment of the apparatus according to the invention, together with a measuring device according to the invention for determining a position of the substrate table.

For exact positioning of the respective substrate table 14 relative to the optics head 12, an interferometric measuring device 140 is provided, as illustrated in FIG. 7, comprising a mirror bar 142 extending in the Y direction and having a mirror surface 144 which extends parallel to the Y direction and parallel to the Z direction over the width of the substrate table 14. Furthermore, a mirror bar 146, which extends in the X direction and carries a mirror surface 148 extending in the X direction and in the Z direction, is provided on a longitudinal side on the substrate table 14.

The mirror surfaces 144 and 148 are therefore disposed in a fixed position relative to the substrate table 14.

Furthermore, the optics head 12 is provided with a mirror surface 150 which extends parallel to the Y direction and the Z direction and therefore parallel to the mirror surface 144 and with a mirror surface 152 which extends parallel to the X direction and to the Z direction and therefore parallel to the mirror surface 148.

Both mirror surfaces 150 and 152 are fixedly connected to the optics head 12.

Furthermore, the measuring device 140 comprises two interferometer units 154 and 156, each of which emits a measuring beam 158 and 160, respectively, in the direction toward the mirror surface 144 of the substrate table 14 and, moreover, a measuring beam 162 and 164, respectively, toward the mirror surface 150. Each of the interferometer units 154 and 156 is therefore able, by establishing the path differences which can be determined by means of the measuring beams 158 and 162, and 160 and 164, respectively, to determine the spacings between the mirror surface 144 and the mirror surface 150, which thereby indicates the precise relative position of the substrate table 14, in this case the substrate table 14b, relative to the optics head, in this case the optics head 12b.

For this purpose, the measuring beams 158 to 164 run exactly parallel to the X direction, and it is also preferable for the measuring beams 162 and 164 to run in a reference plane 188 and the measuring beams 158 and 160 to run in a measuring plane 189, both of which planes, for their part, run parallel to the guide plane 22, in this case the guide plane 22b.

It is preferable for the two interferometer units 154 and 160 to be disposed in such a way that their measuring beams 158 and 162, and 160 and 164, respectively, are disposed at a spacing from one another in the Y direction, so that it is possible not only to determine the relative position of the mirror surfaces 144 and 150 in the X direction, but also to establish whether the mirror surfaces 150 and 144 are oriented exactly parallel to one another. If there are deviations from a precisely parallel path, the substrate table 14b has turned about an axis parallel to the Z direction.

Furthermore, the measuring device 140 also comprises an interferometer unit 170 which generates a measuring beam 172, which is directed toward the mirror surface 148 and is in the measuring plane 189, and a measuring beam 174, which is directed toward the mirror surface 152 and is in the reference plane 188, and can use the path difference of these measuring beams 152 and 154, which run in the Y direction, to determine the difference in position between the optics head 12b and the substrate table 14b in the Y direction.

To ensure that all the interferometer units 154, 156 and 170 work with the same wavelength, they have associated with them a common laser light source 176, which generates wavelength-stabilized laser radiation 178 that is divided via beam splitters 180 to 186 between the interferometer units 154, 156 and 170, so that all the interferometer units 154, 156 and 170 operate with laser radiation of the same wavelength.

All the interferometer units 154, 156 and 170 are disposed in a stationary position relative to the pedestal body 40, so that the substrate table 14 moves relative to the measuring beams 158 and 160 and 172, but in any position of the substrate table 14 these measuring beams still impinge on the corresponding mirror surface 144 or 148, with the extent of the mirror surface 144 in the Y direction and the extent of the mirror surface 148 in the X direction preferably being greater than the paths along which the substrate table 14 is movable in the Y direction and the X direction.

With the relative spacings between the mirror surface 150 and the mirror surface 144 recorded by the interferometer units 154 and 156, the control unit 130 is able to actuate the respective linear drive, in this case the linear drive 80b, in such a way that the optics head 12 is in the desired relative position with respect to the substrate table 14 and therefore with respect to the substrate materials or wafers 16b and 18b.

Figure 8:
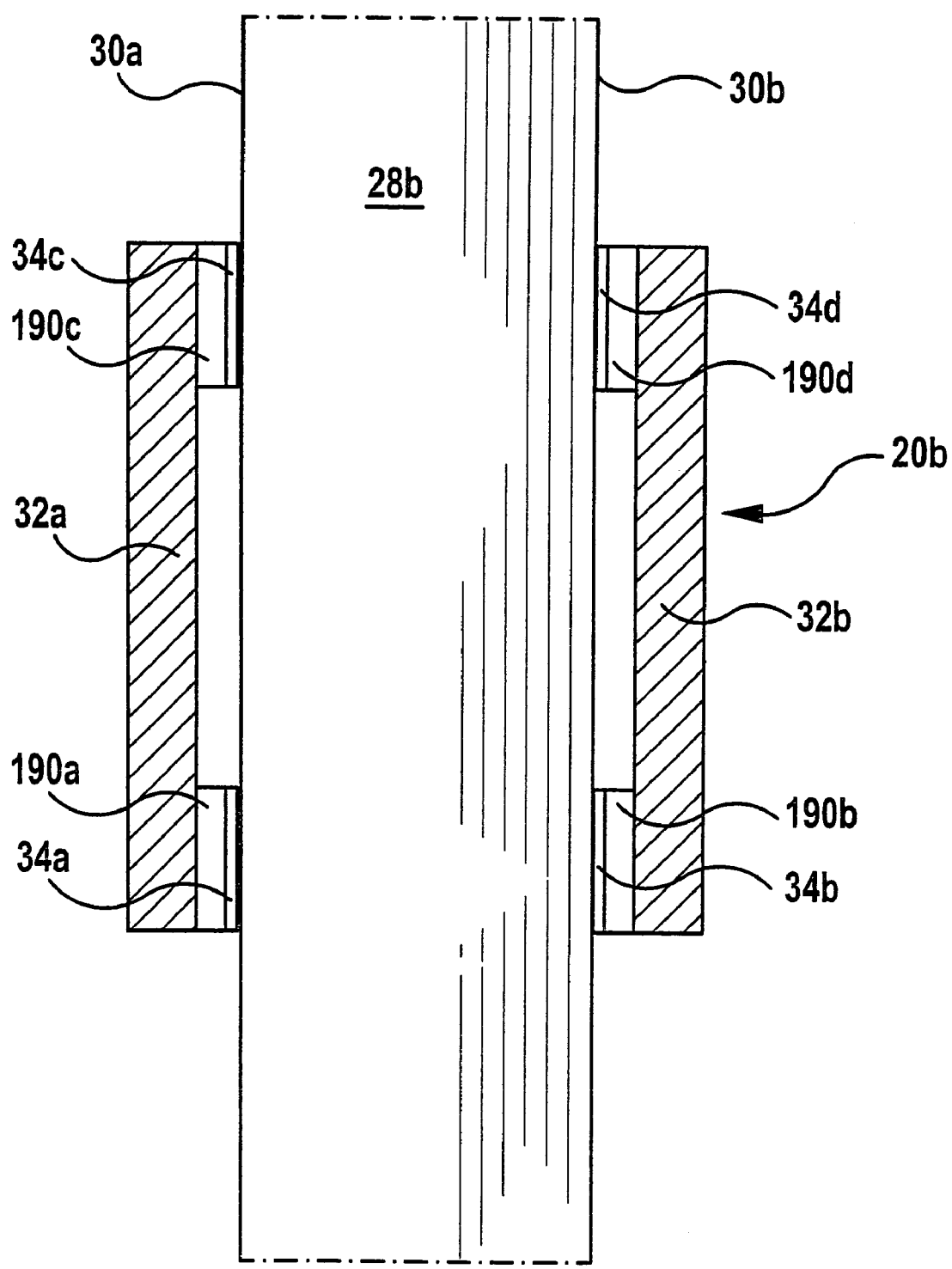
FIG. 8 shows a section on line 8—8 in FIG. 3.

Furthermore, any rotation of the mirror surface 144 relative to the mirror surface 170 about an axis of rotation running in the Z direction which has been picked up by the interferometer units 154 and 156 can be corrected by the control unit 130 by virtue of the devices for generating an air cushion 34a to 34b, which are disposed at the side limbs 32a, 32b of the carrier carriage 20, each being seated on piezo elements 190a to d, the thickness of which can be varied controllable by the control unit 130, thereby creating the option of varying the spacing between the devices 34a to 34d for generating an air cushion from the side limbs 32a and 32b, so that by suitable actuation of the piezo elements 190a to 190d it is possible to rotate the carrier carriage 20 a small amount about an axis parallel to the Z direction, enabling the mirror surface 144 to be held such that it is oriented exactly parallel to the mirror surface 150. (FIG. 8)

Furthermore, the control unit 130 is able to record the displacement of the substrate table 14 in the Y direction as a function of the measured spacing between the mirror surface 152 and the mirror surface 148 and to actuate the linear motors 60 and 62, in this case the linear motors 60b and 62b, accordingly, and at the same time also to synchronously actuate the linear motor 114 so as to move the drive carriage 82.

Figure 9:
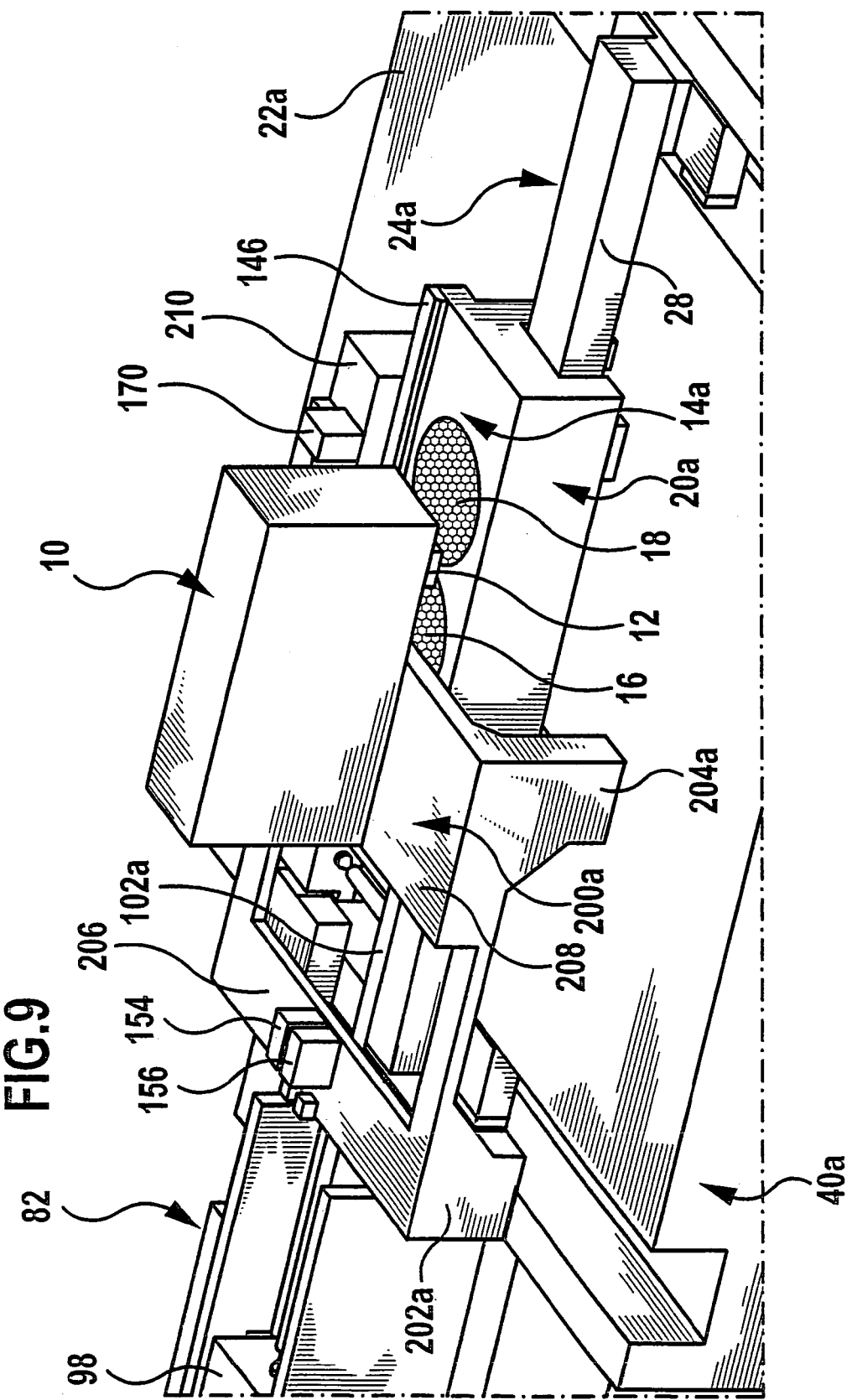
FIG. 9 shows an enlarged perspective illustration, similar to FIG. 1, of part of the first exemplary embodiment of the apparatus according to the invention, with the exposure device illustrated in full.

The structural realization of the stationary positioning of the interferometer units 154 and 156, and 170, relative to the pedestal body 140 is illustrated in detail in FIG. 9.

To ensure that the positioning of the interferometer units 154 and 156 does not impede the movability of the coupling rod and of the substrate table, in this case of the coupling rod 102a and the substrate table 14a, a bridge body, which is denoted overall by 200, is seated on the pedestal body 40, which bridge body is supported, by means of outer foot elements 202 and 204, on the guide plane 22, in this case the guide plane 22a, and by means of bridge regions 206 and 208 engages over the movement range of the carrier carriage 20, in this case of the carrier carriage 20a, and of the substrate table 14, in this case the substrate table 14a.

In this case, by way of example, the two interferometer units 154 and 156 are seated on the bridge region 206 disposed so as to face the drive unit 78, with the coupling rod 102a passing through beneath the bridge region 206, while the exposure device 10, which on its side facing the substrate table 14 carries the optics head 12, is seated on the bridge region 208 which extends across the substrate table 14 and the carrier carriage 20.

The exposure device 10 is formed and works in the same way as described, for example, in German Patent Application 101 60 917.5, to which reference is made in full in this respect.

Furthermore, the interferometer unit 170 is seated on a plinth region 210 which is provided to the side of the bridge body 200 and is disposed outside a range of movement of the carrier carriage 20 and of the substrate table 14.

Figure 10:
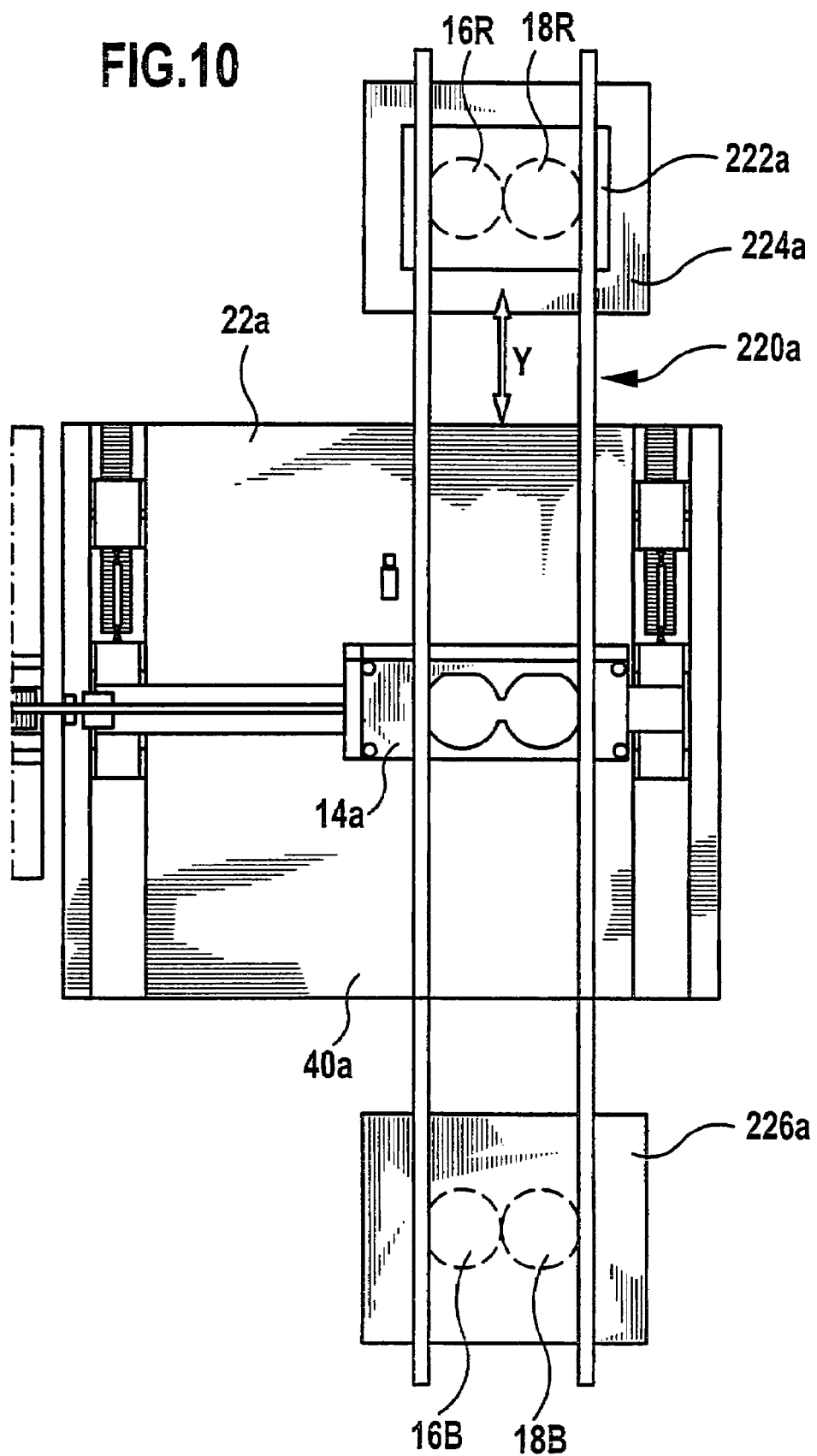
FIG. 10 shows an excerpt plan view similar to FIG. 6 of a second exemplary embodiment of an apparatus according to the invention.

As illustrated in FIG. 10, a second exemplary embodiment of the apparatus according to the invention comprises a transport system, which is denoted overall by 220 and has a gripper device 222, which is movable, for example, in the Y direction and can be used to grip unexposed substrate materials which have been prepared in a preparation station 224, and in particular pre-positioned, for example the wafers 16R and 18R, and to feed them to the substrate table 14 in the pre-positioned arrangement.

Furthermore, the gripper device 222 can also be moved to a removal station 226, which is disposed on an opposite side of the pedestal body 40 from the preparation station 224 and in which the exposed wafers 16B, 18B can be put down.

This makes it possible to optimize the time required for positioning of the wafers 16, 18 on the substrate table 14 and therefore to optimize the times required for the exposure of the individual substrate materials 16, 18.

Figure 11:
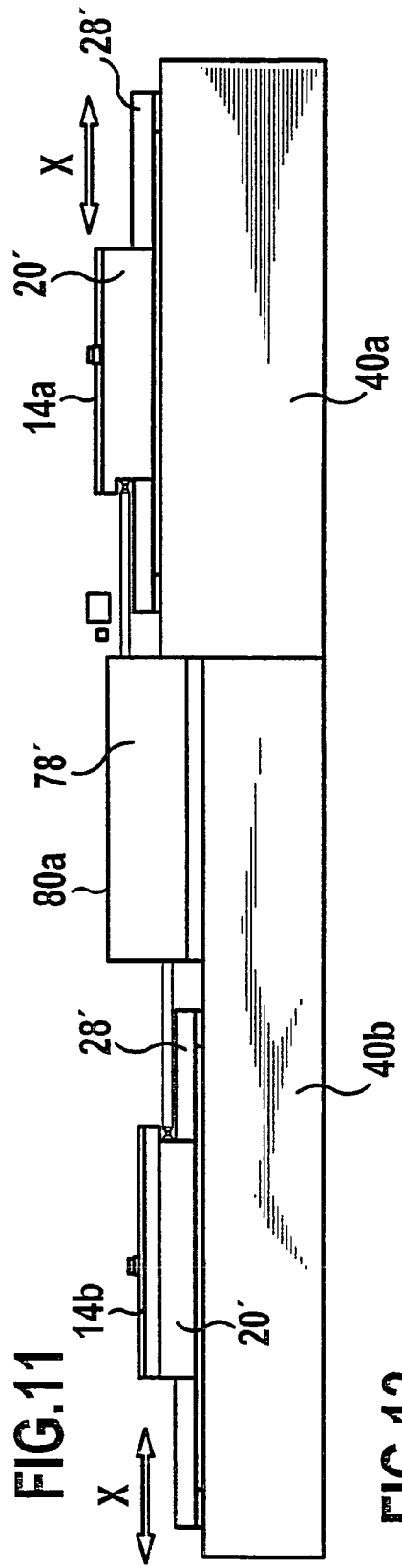
FIG. 11 shows an illustration similar to FIG. 4 of a third exemplary embodiment of the apparatus according to the invention.
Figure 12:
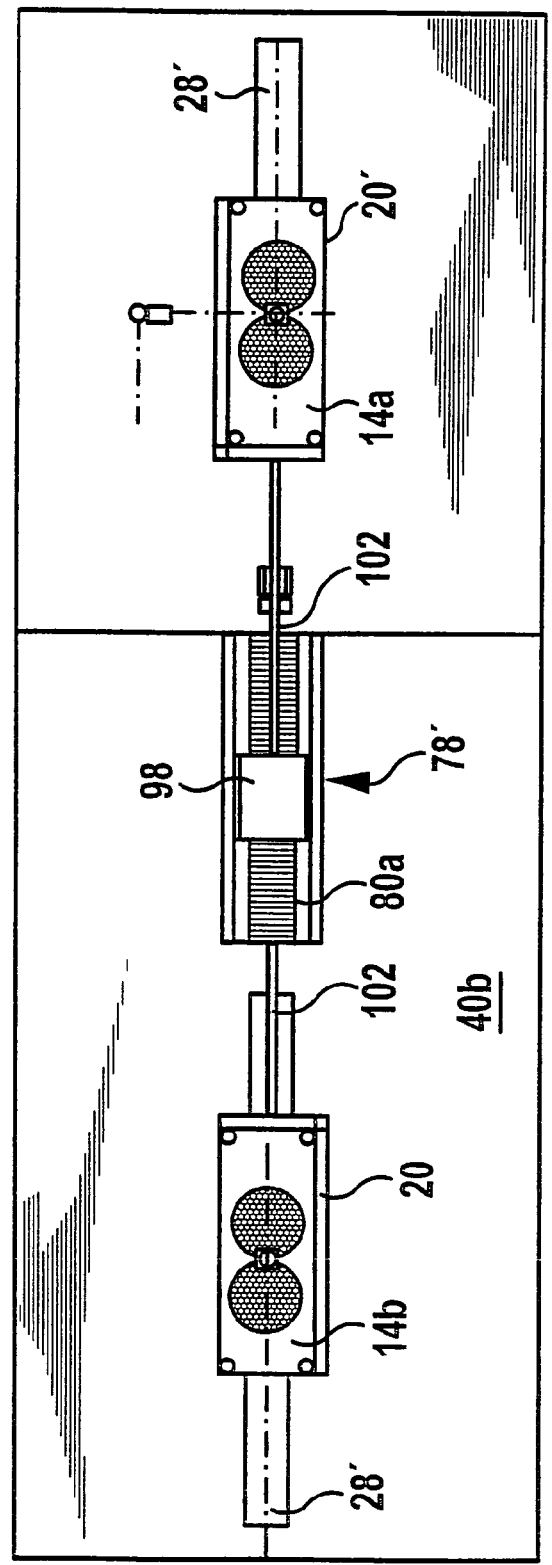
FIG. 12 shows an illustration similar to FIG. 6 of the third exemplary embodiment of the apparatus according to the invention.
Figure 13:
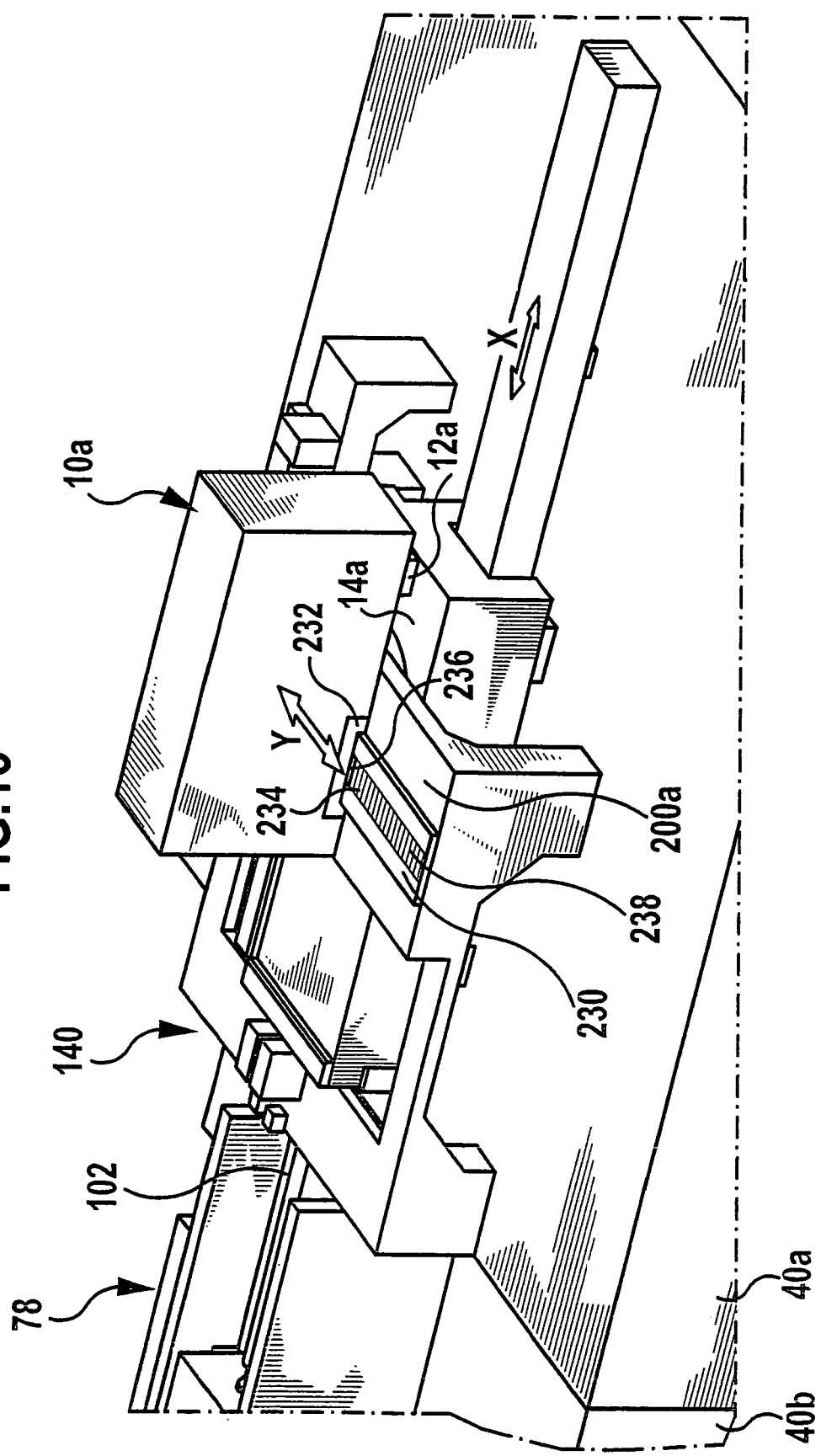
FIG. 13 shows an illustration similar to FIG. 9 of the third exemplary embodiment of the apparatus according to the invention.

In a third exemplary embodiment of the apparatus according to the invention, illustrated in FIGS. 11 to 13, those elements which are identical to those of the exemplary embodiments described above are provided with the same reference symbols, and consequently in this respect reference can be made in full to the statements given above.

In the third exemplary embodiment, the substrate tables 14a and 14b are disposed, in the same way as in the exemplary embodiments given above, on carrier carriages 20' which are provided for them but are guided in the X direction on guide bars 28 which are stationary in the Y direction, the guide bars 28 being held non-displaceably on the pedestal bodies 40a and 40b, so that the carrier carriages 20' is movable only in the X direction relative to the pedestal bodies 40a, 40b.

Furthermore, a drive unit 78' is provided, but it is no longer disposed on a separate pedestal body, but rather, by way of example, is also seated on the pedestal body 40b; the linear drives 80, which drive the carrier carriages 20' in the X direction in the known way, are disposed in the drive unit 78' in a known way.

To produce the relative movement between the optics head 12 and the respective substrate table, in FIG. 13 the optics head 12a and the substrate table 14, the entire exposure device 10, in FIG. 13 the exposure device 10a, is guided in the Y direction on the bridge body denoted overall by 200, in FIG. 13 the bridge body 200a, with a guide 230 extending in the Y direction provided on the bridge body 200a, along which guide an optics carriage 232, which carries the respective exposure device 10 and is by way of example likewise air-supported, can be moved in the Y direction by a linear drive 234, the traveller 236 of which is connected to the optics carriage 232 and the stator 238 of which is integrated in the Y guide 230.

It is therefore possible, by moving the exposure device 10 in the Y direction and moving the substrate table 14 in the X direction, to generate the relative movement between the substrate table 14 and the exposure device 10 in the desired simple way.

In this exemplary embodiment, the interferometric measuring device 140 in principle operates in the same way as described in connection with the first exemplary embodiment, the only difference being that it is necessary for the mirror surface 150 which is fixedly connected to the optics head 12 and which extends parallel to the Y direction to have an extent in the Y direction which corresponds to the path that can be described by the exposure device 10 in the Y direction.

Figure 14:
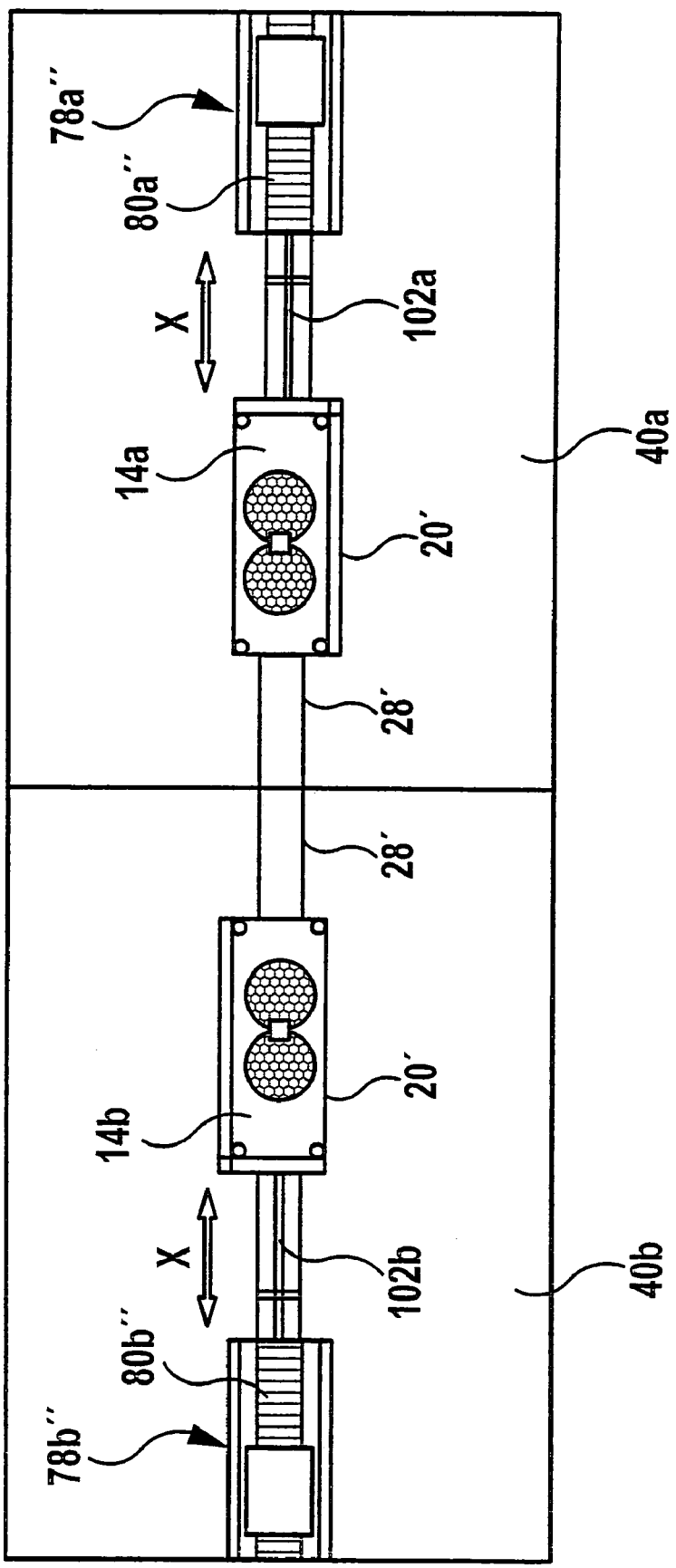
FIG. 14 shows an illustration similar to FIG. 6 of a fourth exemplary embodiment of an apparatus according to the invention for exposing substrate materials.

In a fourth exemplary embodiment, illustrated in FIG. 14, two drive units 78″*a* and 78″*b* are provided, the drive unit 78″*a* being used to drive the substrate table 14*a*, and the drive unit 78″*b* being used to drive the substrate table 14*b*.

Each of these drive units 78″ is provided with a linear drive 80″*a* or 80″*b*, respectively. Furthermore, each of the linear drives 80″*a* and 80″*b* is coupled to the respective substrate table 14*a* and 14*b*, respectively, by means of a coupling rod 102*a* and 102*b*, respectively, which has already been described in accordance with the invention.

Unlike in the exemplary embodiments described above, in the fourth exemplary embodiment the drive units 78″*a* and 78″*b* are furthermore disposed in such a way that the substrate tables 14*a*, 14*b* are located between them, i.e. for each substrate table 14*a*, 14*b* the associated drive unit 78″*a* or 78″*b* is disposed on the opposite side from the respective other substrate table 14*b* or 14*a*.

This solution has the advantage that the linear drives 80″*a* and 80″*b* can easily be supplied with energy and actuated, and moreover maintenance of the linear drives 80″*a* and 80″*b* can also be simplified.

Furthermore, it is easier to feed the two substrate tables 14*a*, 14*b*.

Otherwise, the substrate tables 14*a*, 14*b* are disposed in the same way as described in connection with the preceding exemplary embodiments, on carrier carriages 20′ which are guided in the X direction on guide bars 28′; in the fourth exemplary embodiment too, it is preferable for the guide bars 28′ to be disposed in a stationary position on the pedestal bodies 40*a* and 40*b*, such that they therefore cannot move in the Y direction. The relative movement between the substrate tables 14*a* and 14*b* and the respective optics head 12*a, b* is realized in the same way as in the third exemplary embodiment, by virtue of the exposure devices 10*a*, 10*b*, being disposed such that they are movable in the Y direction.

What is claimed is:

1. Apparatus for exposing substrate materials, comprising:
   at least one optical exposure device;
   at least one substrate table;
   a carrier for said substrate table guided in an X-direction on carrier guide surfaces; and
   an apparatus for generating a relative movement between the exposure device and the substrate table in two directions running transversely with respect to one another, the relative movement being effected with a greater dynamic in a main direction than in a secondary direction, said apparatus for generating the relative movement comprising at least one main drive for generating the relative movement in the main direction and at least one secondary drive for generating the relative movement in the secondary direction;
   at least one of said main drive and said secondary drive comprising a linear drive, said linear drive being disposed so as to be separate from said substrate table and having a traveller guided in the X-direction on traveller guide surfaces, said traveller guide surfaces being separate from said carrier guide surfaces.

2. Apparatus according to claim 1, wherein:
   two substrate tables are provided, said substrate tables moving substantially in opposite directions.

3. Apparatus according to claim 2, wherein a main drive is associated with each substrate table.

4. Apparatus according to claim 3, wherein the main drive is disposed so as to be separate from the substrate table.

5. Apparatus according to claim 3, wherein a traveller of the main drive drives the respectively associated substrate table via a drive connection which is rigid in the main direction.

6. Apparatus according to claim 2, wherein each substrate table is disposed on a carrier carriage.

7. Apparatus according to claim 6, wherein the traveller and the carrier carriage of the substrate table are coupled to one another via the drive connection which is rigid in the X-direction.

8. Apparatus according to claim 2, wherein the main drives for the substrate tables are combined in a common drive unit.

9. Apparatus according to claim 8, wherein the drive carriage carries the common drive unit.

10. Apparatus according to claim 8, wherein the substrate tables are disposed on opposite sides, as seen in the main direction, of the drive unit.

11. Apparatus according to claim 8, wherein the main drives work in drive planes running at a spacing from one another in a direction that is transverse with respect to the main direction and transverse with respect to the secondary direction.

12. Apparatus according to claim 11, wherein a traveller of the main drive for one of the substrate table works in a first drive plane, and the traveller of the main drive for the other substrate table works in a second drive plane, which is parallel to the first drive plane.

13. Apparatus according to claim 2, wherein the substrate tables are disposed between the main drives.

14. Apparatus according to claim 2, wherein an exposure device is associated with each of the substrate tables.

15. Apparatus according to claim 14, wherein the substrate table and the respectively associated exposure device are movable relative to one another in the main direction and the secondary direction.

16. Apparatus according to claim 1, wherein the apparatus has a transport system which for transporting substrate materials from a preparation station onto the substrate table.

17. Apparatus according to claim 16, wherein the substrate materials can be pre-positioned in the preparation station and can be placed on the substrate table in a pre-positionable manner by the transport system.

18. Apparatus according to claim 1, wherein the apparatus has a transport system which for transporting exposed substrate materials from the substrate table into a removal station.

19. Apparatus according to claim 1, wherein the exposure device is held in a stationary position on the pedestal body.

20. Apparatus according to one claim 1, wherein the substrate table is disposed on a carrier carriage which is movable in the main direction and the secondary direction relative to a pedestal body.

21. Apparatus according to claim 20, wherein the carrier carriage is guided movably, in the direction of the main direction, on a guide carriage.

22. Apparatus according to claim 21, wherein the carrier carriage is guided on the guide carriage only so as to prevent relative movement in the secondary direction.

23. Apparatus according to claim 21, wherein the carrier carriage is guided on the guide carriage using air guides.

24. Apparatus according to claim 20, wherein the carrier carriage is guided in a direction which is transverse with respect to the main direction and secondary direction on a guide plane of the pedestal body.

25. Apparatus according to claim 24, wherein the carrier carriage is guided on the pedestal body by means of air guides.

26. Apparatus according to claim 21, wherein the substrate table can be oriented relative to the guide carriage in the direction of the secondary direction.

27. Apparatus according to claim 26, wherein the substrate table can be oriented relative to the guide carriage by positioning elements acting in the secondary direction.

28. Apparatus according to claim 27, wherein the positioning elements can be actuated by a control unit.

29. Apparatus according to claim 28, wherein the positioning elements are piezo elements.

30. Apparatus according to claim 21, wherein the guide carriage can be moved in the secondary direction by two secondary drives which are disposed at a spacing from one another in the main direction.

31. Apparatus according to claim 21 wherein the main drive is seated on a drive carriage which is separate from the guide carriage and which is guided movably in the secondary direction on the drive pedestal body by a secondary drive.

32. Apparatus according to claim 31, wherein the drive carriage is guided transversely with respect to the main direction and secondary direction on a guide plane of the drive pedestal body.

33. Apparatus according to claim 31, wherein the drive carriage is guided on the drive pedestal body by means of air guides.

34. Apparatus according to claim 31, wherein the drive carriage is movable synchronously with respect to the guide carriage.

35. Apparatus according to claim 31, wherein a traveller of the main drive is guided movably in the main direction on the drive carriage.

36. Apparatus according to claim 35, wherein a drive connection which is rigid in the main direction is provided between the traveller and the carrier carriage.

37. Apparatus for exposing substrate materials, comprising:
at least one optical exposure device;
at least one substrate table;
an apparatus for generating a relative movement between the exposure device and the substrate table in two directions running transversely with respect to one another, the relative movement being effected with a greater dynamic in a main direction than in a secondary direction, said apparatus for generating the relative movement comprising at least one main drive for generating the relative movement in the main direction and at least one secondary drive for generating the relative movement in the secondary direction; and
an interferometric measuring device for recording a relative position of the substrate table and the exposure device, said interferometric measuring device operating with an optics head of the optical exposure device as reference point.

38. Apparatus according to claim 37, wherein the interferometric measuring device records the position of the optics head in a reference plane running parallel to the main direction and to the secondary direction and records the position of the substrate table in a measuring plane running parallel to the reference plane.

39. Apparatus according to claim 38, wherein the interferometric measuring device, in the reference plane and in the measuring plane, works with measuring beams which impinge on mirrors extending in the main direction and the secondary direction.

40. Apparatus according to claim 39, wherein the optics head is provided with a reflection mirror extending in the main direction and a reflection mirror extending in the secondary direction.

41. Apparatus according to claim 39, wherein the substrate table is provided with a mirror which, at least in the main direction, extends over the maximum path of the substrate table.

42. Apparatus according to claim 39, wherein the substrate table is provided with a mirror which extends at least over the maximum path in the secondary direction.

43. Apparatus according to claim 37, wherein the interferometric measuring device carries out measurements using laser light of the same wavelength in both the main direction and the secondary direction.

44. Apparatus according to claim 42, wherein the interferometric measuring device works using laser light from a common laser radiation source.

45. Apparatus for exposing substrate materials, comprising:
at least one optical exposure device;
at least one substrate table;
an apparatus for generating a relative movement between the at least one exposure device and the at least one substrate table in two directions running transversely with respect to one another, the relative movement being effected with a greater dynamic in a main direction than in a secondary direction, said apparatus for generating the relative movement comprising at least one main drive for generating the relative movement in the main direction and at least one secondary drive for generating the relative movement in the secondary direction;
a pedestal body carrying said at least one exposure device and the at least one substrate table; and
a drive pedestal body on which the drive for the main direction is seated, said drive pedestal body is disposed so as to be physically separate from said pedestal body which carries the exposure device and the substrate table.

46. Apparatus for exposing substrate materials, comprising:
a pedestal body;
a bridge body arranged on said pedestal body;
at least one optical exposure device, movable in a first direction with respect to said bridge body;
at least one substrate table movable in a second direction transverse to said first direction with respect to said pedestal body;
an apparatus for generating a relative movement between the exposure device and the respective substrate table in two directions running transversely with respect to one another, the relative movement being effected with a greater dynamic in a main direction than in a secondary direction, said apparatus for generating the relative movement comprising at least one main drive for generating the relative movement in the main direction and at least one secondary drive for generating the relative movement in the secondary direction.

47. Apparatus for exposing substrate materials, comprising:
at least one optical exposure device;
at least one substrate table;

a carrier for said substrate table guided in an X-direction on guide surfaces by a first guide element;

an apparatus for generating a relative movement between the exposure device and the substrate table in two directions running transversely with respect to one another, the relative movement being effected with a greater dynamic in a main direction than in a secondary direction, said apparatus for generating the relative movement comprising at least one main drive for generating the relative movement in the main direction and at least one secondary drive for generating the relative movement in the secondary direction;

said main drive having a traveller guided in the X-direction on guide surfaces by a second guide element; and a drive connection connecting said traveller and said substrate table, said drive connection being rigid in the X-direction and flexible transverse to said X-direction.

* * * * *

UNITED STATES PATENT AND TRADEMARK OFFICE
CERTIFICATE OF CORRECTION

PATENT NO. : 7,019,818 B2 Page 1 of 1
APPLICATION NO. : 10/941308
DATED : March 28, 2006
INVENTOR(S) : Opower et al.

It is certified that error appears in the above-identified patent and that said Letters Patent is hereby corrected as shown below:

Title page,
Item [73], should read:
-- [73] Assignee: KLEO Halbleitertechnik GmbH & Co KG, Tettnang (DE) --.

Signed and Sealed this

Twentieth Day of June, 2006

JON W. DUDAS
*Director of the United States Patent and Trademark Office*